(12) United States Patent
Chou et al.

(10) Patent No.: US 9,571,202 B2
(45) Date of Patent: Feb. 14, 2017

(54) OPTICAL CONNECTOR ASSEMBLY

(71) Applicant: OptoMedia Technology Inc., Hsinchu County (TW)

(72) Inventors: Hui-Tsuo Chou, Hsinchu County (TW); Tung Lou Lin, Hsinchu County (TW); Hsieh Yi Chou, Hsinchu County (TW)

(73) Assignee: OPTOMEDIA TECHNOLOGY INC., Hsinchu County (TW)

( * ) Notice: Subject to any disclaimer, the term of this patent is extended or adjusted under 35 U.S.C. 154(b) by 0 days.

(21) Appl. No.: 14/624,859

(22) Filed: Feb. 18, 2015

(65) Prior Publication Data
US 2015/0241649 A1  Aug. 27, 2015

Related U.S. Application Data

(60) Provisional application No. 61/943,074, filed on Feb. 21, 2014.

(51) Int. Cl.
*G02B 6/36* (2006.01)
*G02B 6/12* (2006.01)
*H04B 10/50* (2013.01)
*G02B 6/42* (2006.01)
*H04B 10/60* (2013.01)
(Continued)

(52) U.S. Cl.
CPC ............ *H04B 10/501* (2013.01); *G02B 6/428* (2013.01); *G02B 6/4292* (2013.01); *H04B 10/60* (2013.01); *H05K 3/301* (2013.01); *G02B 6/0066* (2013.01); *G02B 6/0083* (2013.01); *G02B 6/426* (2013.01); *G02B 6/4249* (2013.01); *G11B 7/0933* (2013.01); *G11B 7/0935* (2013.01); *G11B 7/13925* (2013.01); *H05K 3/303* (2013.01); *H05K 3/3405* (2013.01); *H05K 2201/09163* (2013.01); *H05K 2201/10121* (2013.01); *H05K 2201/10151* (2013.01); *H05K 2201/10303* (2013.01)

(58) Field of Classification Search
CPC ......... G02B 6/43; G02B 6/428; G02B 6/4257; G02B 6/4292; G02B 6/4245; G02B 6/4284; G02B 6/4285; H05K 3/30; H04B 10/501; H04B 10/60
USPC ............................................... 385/14, 88–91
See application file for complete search history.

(56) References Cited

U.S. PATENT DOCUMENTS

| | | | |
|---|---|---|---|
| 2003/0103735 A1* | 6/2003 | Anderson | G02B 6/266 385/91 |
| 2003/0103740 A1* | 6/2003 | Edwards | G02B 6/4292 385/94 |

(Continued)

*Primary Examiner* — Kaveh C Kianni
*Assistant Examiner* — Hung Lam
(74) *Attorney, Agent, or Firm* — Chun-Ming Shih

(57) ABSTRACT

An optical connector assembly, includes: a printed circuit board including a supporting surface and a notch; a fixing portion embedded into the notch and comprising a first surface, a second surface, a lead frame and an electrical pin arranged from the fixing portion to the supporting surface to be flush with the supporting surface, a positioning slot disposed on the first surface; a joint portion comprising a first side, plural openings penetrating the first side, the joint portion extending from an edge of the first side to cover the top of the fixing portion, a positioning pin disposed on the first side; plural chips disposed on the fixing portion; plural fibers inserted through the openings. Wherein the positioning pin is engaged into the positioning slot, such that the fibers are coaxially aligned with the chips for light transmission.

9 Claims, 15 Drawing Sheets

(51) Int. Cl.
*H05K 3/30*     (2006.01)
*G11B 7/09*     (2006.01)
*G11B 7/1392*   (2012.01)
*F21V 8/00*     (2006.01)
*H05K 3/34*     (2006.01)

(56) References Cited

U.S. PATENT DOCUMENTS

| | | | | |
|---|---|---|---|---|
| 2011/0243509 A1* | 10/2011 | Wang | ............ | G02B 6/4246 |
| | | | | 385/88 |
| 2012/0314989 A1* | 12/2012 | Chou | ............ | G02B 6/428 |
| | | | | 385/14 |
| 2013/0064498 A1* | 3/2013 | Chou | ............ | G02B 6/4246 |
| | | | | 385/14 |

* cited by examiner

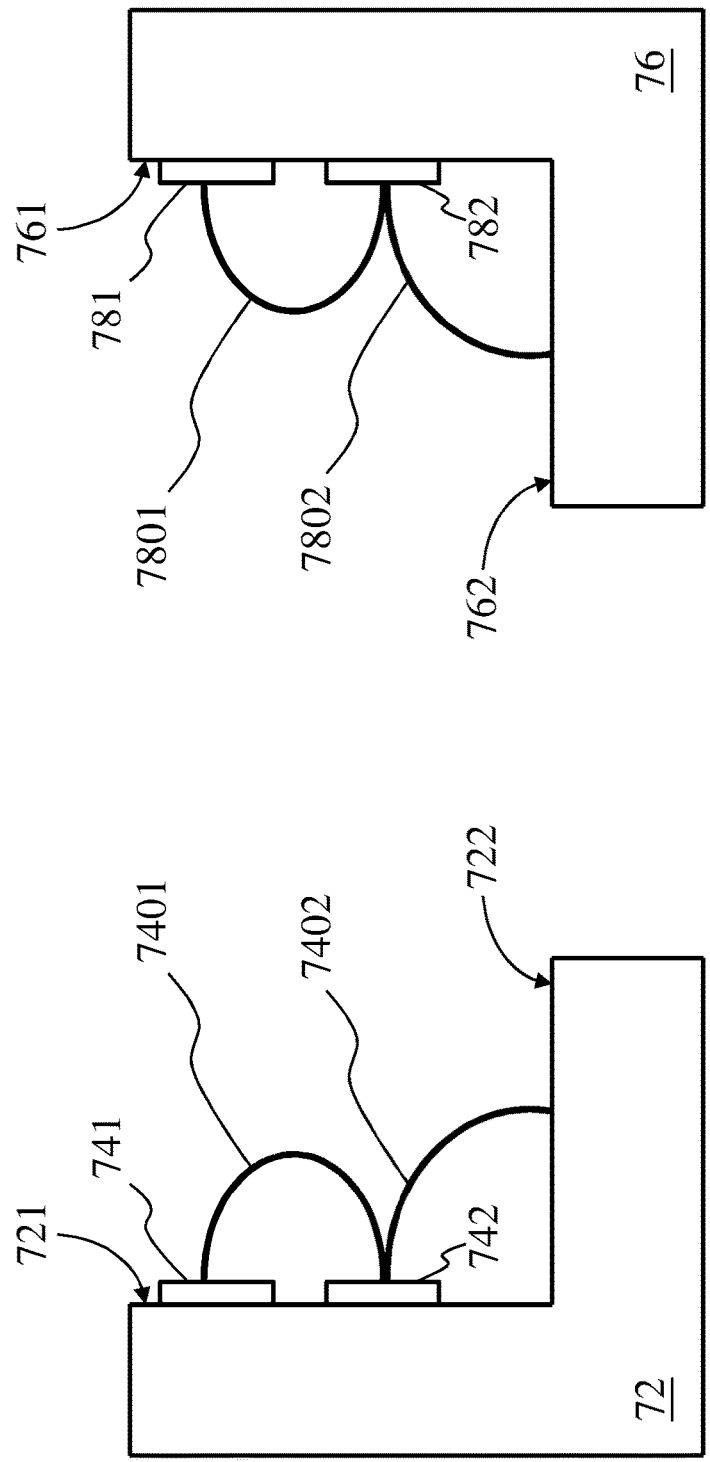

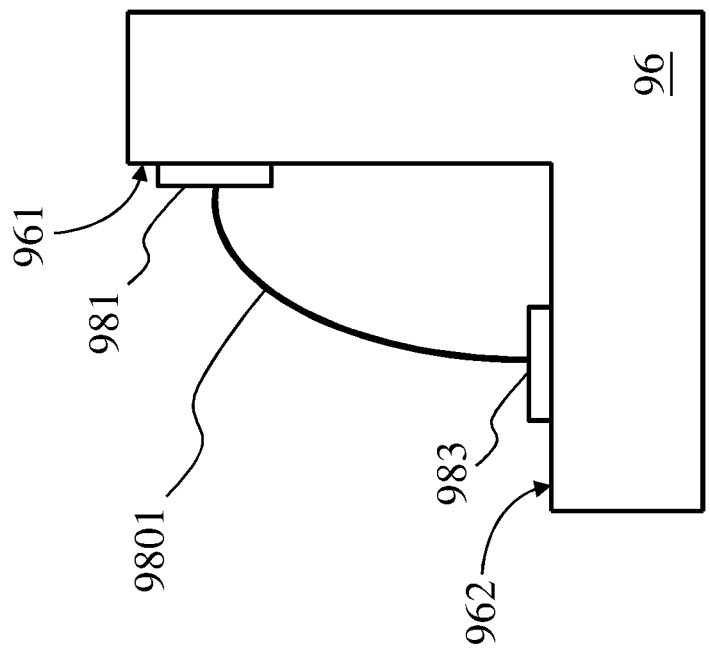
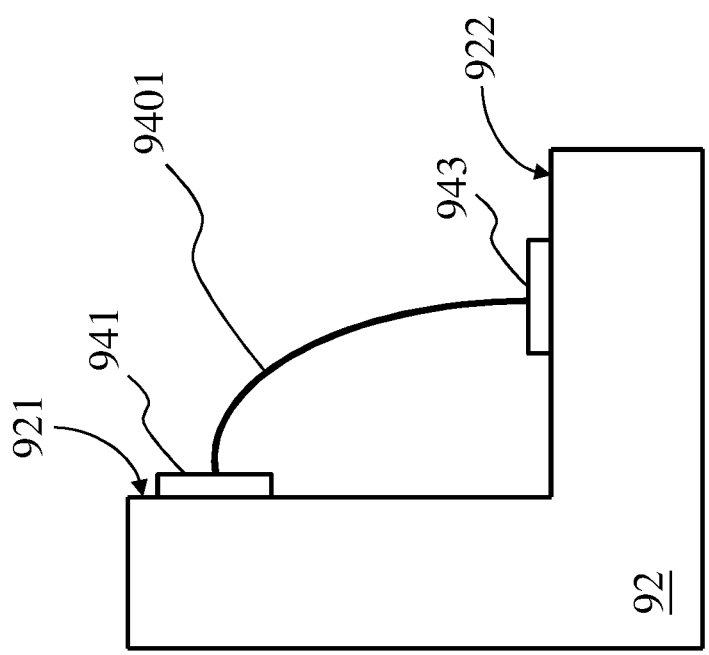
FIG. 9B
FIG. 9A

OPTICAL CONNECTOR ASSEMBLY

CROSS-REFERENCE TO RELATED APPLICATIONS

This application claims an invention which was disclosed in Provisional Application No. 61/943,074, filled on Feb. 21, 2014, entitled "Non-contacting optical transmission interface, opto-electronic device packaging and opto-electronic module". The benefit under 35 USC §119(e) of the United States provisional application is hereby claimed, and the aforementioned application is hereby incorporated herein by reference.

BACKGROUND

Technical Field

The present disclosure relates to an optical connector assembly, and particularly to an optical connector assembly which is mounted at the edge of a PCB with at least one optical module.

Related Art

In recent development of data communication, the multiple integration of optical-electronic component is highly increasing for more applications. For example, in the field of optical communication, optical communication elements are usually integrated on the circuit board such that optical devices are directly connected to electronic devices for converting signals. Thus, these optical components on the circuit board usually include a light guide element, the optical communication components for transmitting and receiving light signals. The light signals are converted to electrical signals by those electronic components. Therefore, the mechanical assemblies in above optical and electronic components will affect the quality of the optical and electrical signals for data communication.

Like, the electronic-magnetic interference is generated by optical-electronic components generally converted propagates in the surrounding. The optical interface of the optical components may lead a delivery loss of an optical transmission path without an accurate alignment for transmitting and receiving light through such as chips and fibers. From above description, the optical and electronic components in optical communication configuration will be combined with other component parts, and therefore, both an accurate alignment and a simple assembly will be required for integrating common optical-electronic devices.

SUMMARY

In view of this, this disclosure provides an optical connector assembly including a PCB, a fixing portion and a joint portion to be assembled for supporting chips and fibers of an optical communication.

An optical connector assembly, comprising: a printed circuit board (PCB) including at least one supporting surface and a notch; a fixing portion embedded into the notch of the PCB and comprising a first surface perpendicular to the supporting surface, at least one second surface perpendicular to the first surface and parallel to the supporting surface, at least one lead frame and at least one electrical pin arranged from the fixing portion to the supporting surface to be flush with the supporting surface for electrically connecting the lead frame, at least one positioning slot disposed on the first surface of the fixing portion; a joint portion comprising a first side parallel to the first surface, a plurality of openings penetrating the first side, the joint portion extending from an edge of the first side to cover the top of the fixing portion, at least one positioning pin disposed on the first side of the joint portion; a plurality of chips disposed on the fixing portion for electrically connecting the lead frame; a plurality of fibers inserted through the plurality of opening of the joint portion; and wherein the positioning pin is engaged into the positioning slot, such that the plurality of fiber is coaxially aligned with the plurality of chip for light transmission.

Through the above technical approaches, an optical connector assembly is achieved by a fixing portion and a joint portion to be mechanical assembled on a PCB for supporting chips and fibers, and furthermore the chip and fiber components are a symmetrical group in the optical connector assembly.

The following embodiments will be described in detail on the above description and the technical solution of this disclosure.

BRIEF DESCRIPTION OF THE DRAWINGS

This disclosure will become more fully understood from the detailed description given herein below for illustration only, and thus not limitative of this disclosure, wherein:

FIG. 7A is a first type of the chip configuration for transmitting light.

FIG. 7B is a first type of the chip configuration for receiving light.

FIG. 9A is a third type of the chip configuration for transmitting light.

FIG. 9B is a third type of the chip configuration for receiving light.

DETAILED DESCRIPTION

Figure 1:
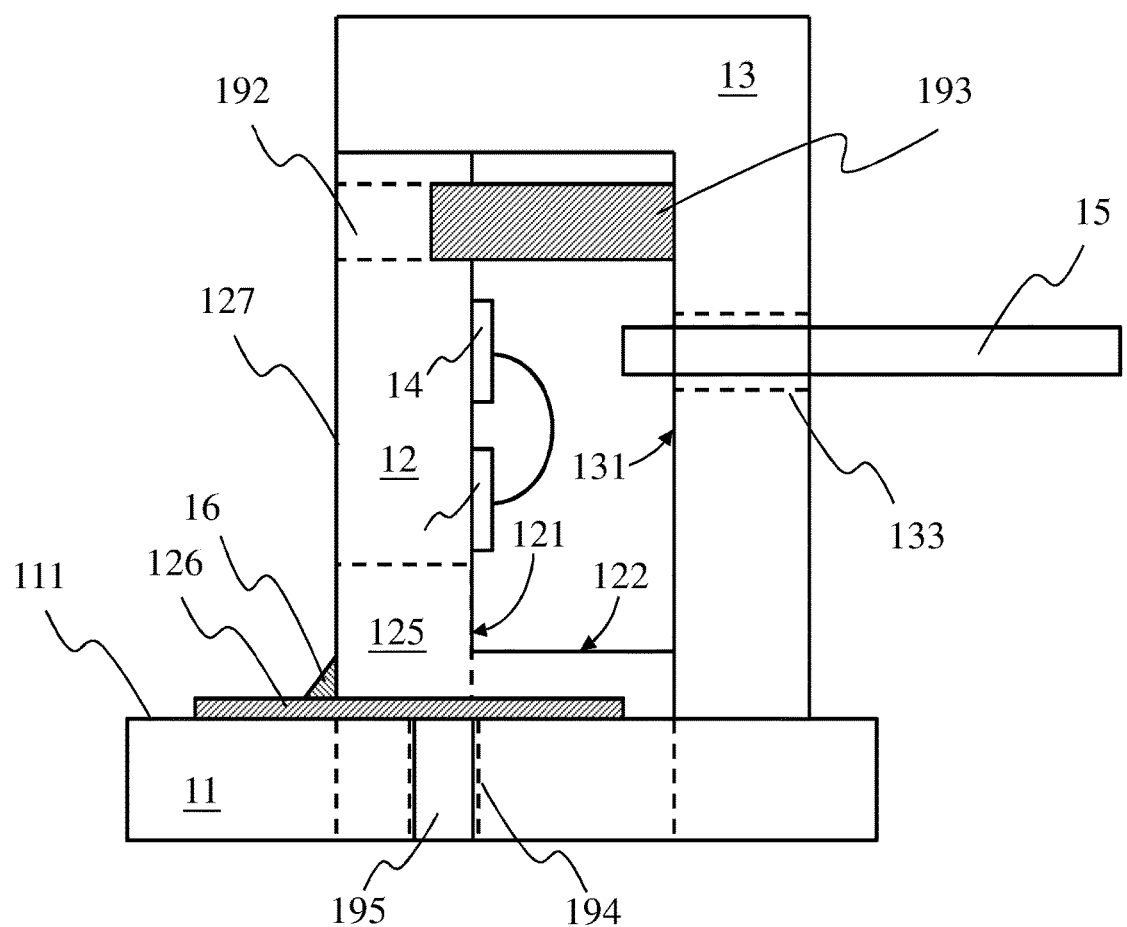
FIG. 1 is a schematic structural view of the optical connector assembly in the first embodiment.

FIG. 1 is an optical connector assembly 1 in the optical communication according to a first embodiment.

In the first embodiment, the optical connector assembly 1 includes a printed circuit board (PCB) 11, a fixing portion 12, a joint portion 13, plural chips 14, and plural fibers 15.

The PCB 11, as a substrate board, includes a supporting surface 111 and a notch 113. The supporting surface 111 supports the structures and components disposed on the PCB 11. The notch 113 is formed on an edge of the PCB 11, and a fixing portion 12 is provided for being embedded into the notch 113.

The fixing portion 12 is embedded into the notch 113 of the PCB 11 to be fixed on the PCB 11. The fixing portion 12 includes a first surface 121 perpendicular to the supporting surface 111, a second surface 122 perpendicular to the first surface 121 and parallel to the supporting surface 111.

The fixing portion 12 further includes plural lead frames 125 and plural electrical pins 126. Each of the electrical pins 126 is arranged from the fixing portion 12 to the supporting surface 111 to be flush with the supporting surface 111. Each of the electrical pins 126 connects one of the lead frames 125 on the fixing portion 12, and the lead frames 125 are mounted to the supporting surface 111 of the PCB 11 by soldering 16 on the side wall 127 of the fixing portion 12.

A joint portion 13 is movable for assembling the optical connector structure and disposed on the supporting surface 111, and the joint portion 13 is located adjacent to the fixing portion 12. The joint portion 13 includes a first side 131 parallel to the first surface 121, and the joint portion 13 is extended from an edge of the first side 131 to cover the top of the fixing portion 12 such that a containing space is defined by the sides of the fixing portion 12 and the joint portion 13. More, the joint portion 13 includes plural openings 133 penetrating the first side 131 for arranging plural fibers 15 through the openings 133.

The chips 14 are disposed on the fixing portion 12 and electrically connect the lead frames 125, and the fibers 15 are inserted through the openings 133 on the joint portion 13. The chips 14 perform signal conversions on optical signals. The chips 14 also can perform a light transmission of transmitting and receiving optical signals. The fibers 15 are used for transmitting light activated from the chips, and the chips 14 and the fibers 15 are disposed on the opposite surfaces of the first surface 121 and the first side 131.

For engagement of the fixing portion 12 and the joint portion 13, plural positioning slots 192 are disposed on the first surface 121 of the fixing portion 12. Furthermore, the positioning pins 193 are disposed on the first side 131 of the joint portion 13. The positioning pins 193 are engaged into the positioning slots 192, such that the fibers 15 is coaxially aligned with the chips 14 for light transmission with a high accuracy.

In addition, plural fixing pins 195 on the fixing portion 12 are mounted to plural fixing slots 194 on the PCB 11 for further engagement of the fixing portion 12 and the joint portion 13. Similarly, another further engagement is attained that a part of the bottom of the fixing portion 12 is embedded into the notch 113 of the PCB 11 along a direction perpendicular to the supporting surface 111 of the PCB 11.

Figure 2:
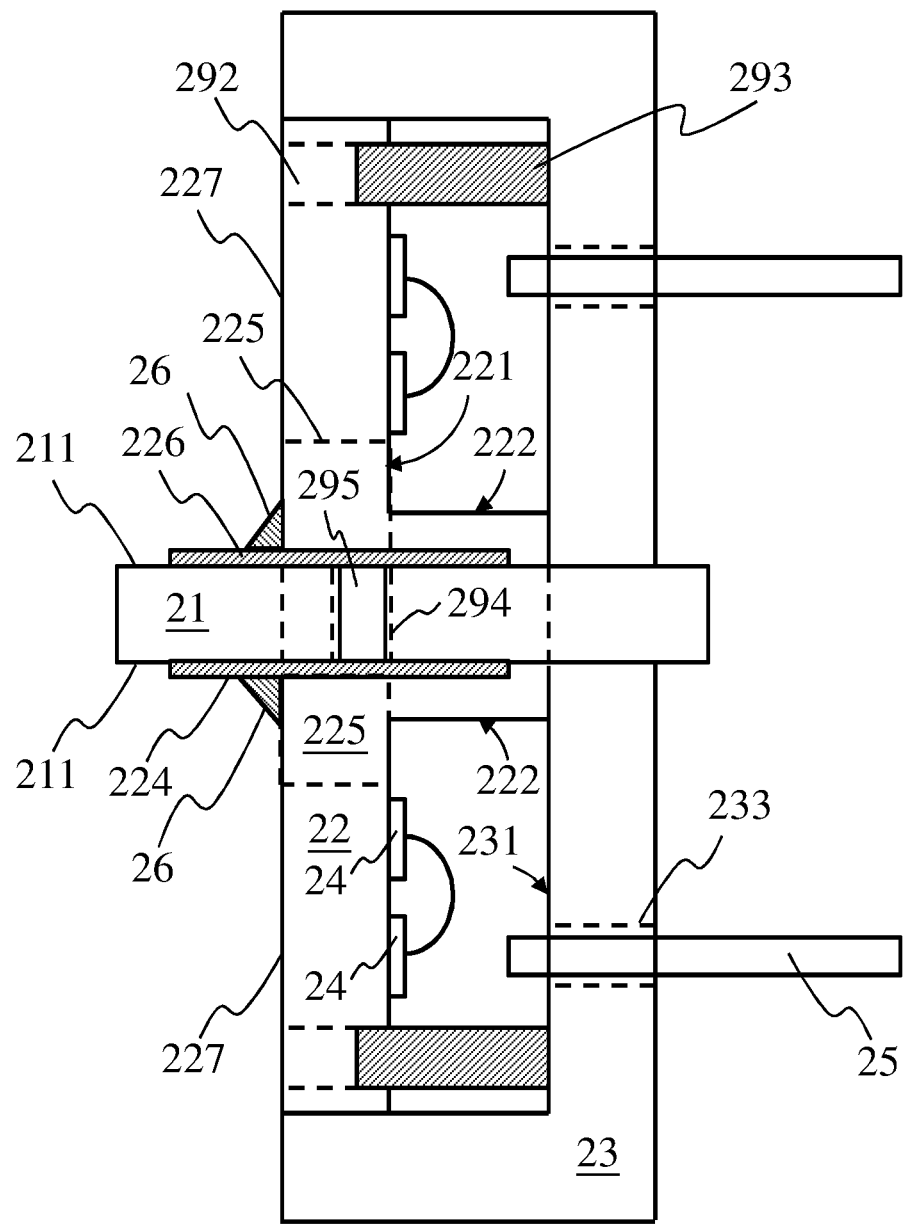
FIG. 2 is a schematic structural view of the optical connector assembly in the second embodiment.

FIG. 2 is an optical connector assembly 2 in the optical communication according to a second embodiment. Compared with the first embodiment, the optical connector assembly 2 in the second embodiment includes a vertically symmetrical configuration with all the structures against a PCB 21. Therefore, the structures of a fixing portion 12 and the joint portion 13 are like mirror-symmetry against the PCB 21 such that the number of chips 24 and fibers 25 are twice than those in the first embodiment. In this arrangement, the date rate is improved for more chips 24 and fibers 25.

The optical connector assembly 2 includes a PCB 21, a fixing portion 22, a joint portion 23, plural chips 24, and plural fibers 25. The PCB 21 includes two supporting surfaces 211 to support the structures on both sides of the PCB 21. At one side of the PCB 21, a notch 213 is provided for engagement of a fixing portion 22. Referring to FIG. 7A, the fixing portion 22 matching the notch 213 of the PCB 21 is further embedded into a guiding groove on the fixing portion 22 to clamp the notch 213 of the PCB 21.

The fixing portion 22 includes a first surface 221 extending through the PCB 21 and perpendicular to the supporting surface 211, and the fixing portion 22 includes two second surfaces 222 perpendicular to the first surface 221 and parallel to the supporting surface 211. The fixing portion 22 includes electrical pins 226 arranged from the fixing portion 22 to the supporting surface 211 to be flush with the supporting surface 111. Therefore, a distance between electrical pins 226 flush with the two supporting surfaces 211 of the PCB 21 will be equal to the thickness of the PCB 21 for the fixing portion 22 embedded into the notch 213 of the PCB 21. And, lead frames 225 on the fixing portion 22 are electrically connected to the electrical pins 226 and mounted to the supporting surface 211 of the PCB 21 by soldering 26 on the side wall 227 of the fixing portion 22.

The joint portion 23 includes a first side 231 parallel to the first surface 221, and the joint portion 23 is extended from an edge of the first side 131 to cover the both sides of the fixing portion 22. More, the joint portion 23 includes openings 233 penetrating the first side 231 for arranging fibers 25 through the openings 233. Then, plural chips 24 are arranged on the fixing portion 22, and plural fibers 25 are inserted through the openings 233 on the joint portion 23. The number of the chips 24 and the fibers 25 get a maximum arrangement due to those additionally disposed on the other side of the PCB 21.

By the way, positioning slots 292 are disposed on the first surface 221 of the fixing portion 22, as well as, positioning pins 293 are disposed on the first side 231 of the joint portion 23. Thus, the positioning pins 293 are engaged into the positioning slots 292, such that the fibers 25 is coaxially aligned with the chips 24 for light transmission with a high accuracy as well as a better data rate in this embodiment.

By the first and second embodiments, the fiber 25 is arranged all the way parallel to the surface of the PCB, which is beneficial to the mechanical design of the device adopting the optical connector assembly of this disclosure. The fiber joint 13, 23 is, but is not limited to, a mechanically transferable fiber connector (MT fiber connector) or a multi-fiber push-on connector (MPO fiber connector).

It is noted that the packaging type of the optical connector assembly of this disclosure can comply with the packaging type of prior art such as TSOP, QFN, or BGA. In above embodiments, the QFN type is used for description purpose. Therefore, the second chip 342, 442 is bonded to a lead frame 125, 225 of the QFN package, and the lead frame 125, 225 is electrically connected to the surface of the PCB by soldering 16, 26 on the side wall 127, 227 of the fixing portion 12, 22. The optical connector assembly can also be assembled with the PCB through a socket such that the optical connector assembly is electrically attached to or detached from the PCB easily which is beneficial to experiments, testing and repairing.

Figure 3:
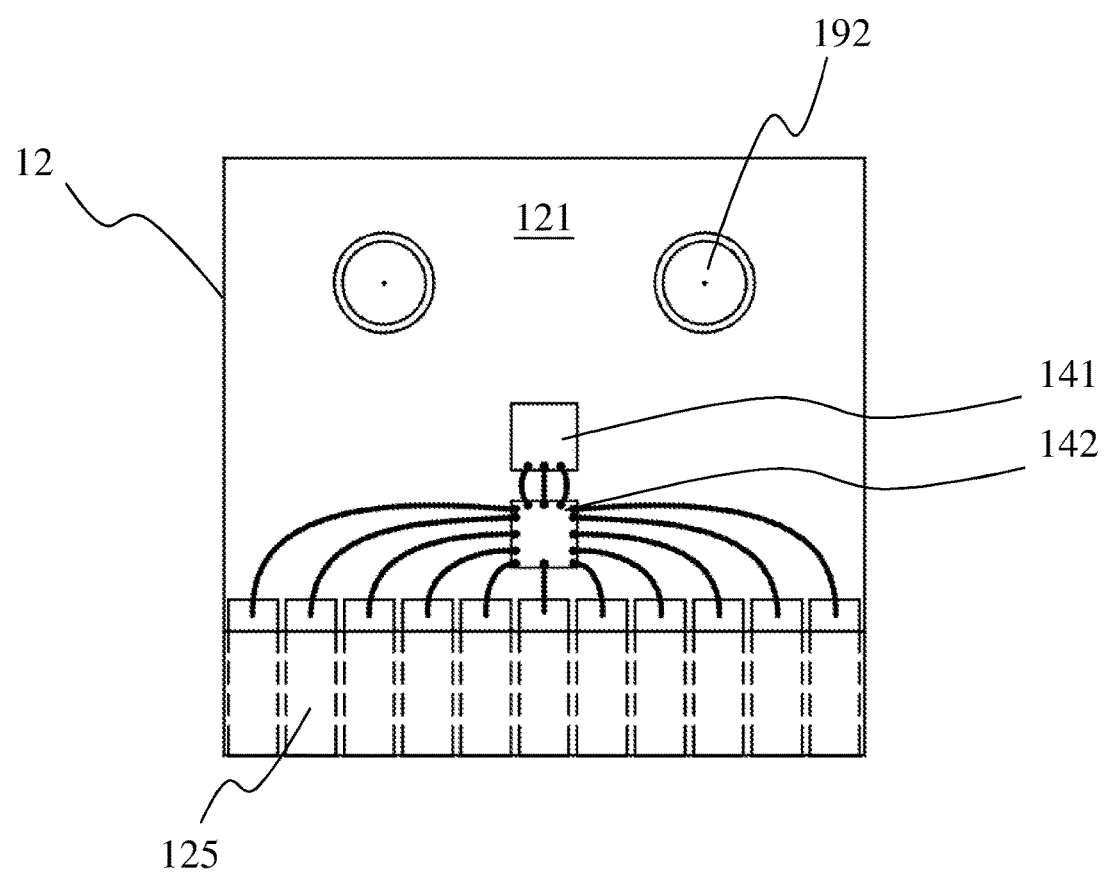
FIG. 3 is a right view of the first embodiment.

FIG. 3 is a right view of the optical connector assembly of this disclosure without the fiber joint 13, 23. The dashed lines show the part of the lead frames 125, 225 covered by the fixing portion 12, 22. The second chip 342, 442 is electrically connected to each of the lead frames 125, 225 by bonding.

It is also noted that the other end of the fiber can further include a fiber connector to enhance flexibility in applications. Other fibers with different length are adapted to be plugged into the fiber connector for different application scenarios. Besides, the optical connector assembly of this disclosure is further encapsulated by transparent epoxy in a molding process to protect the chips from hitting, oxidizing or direct contacting.

Figure 4A:
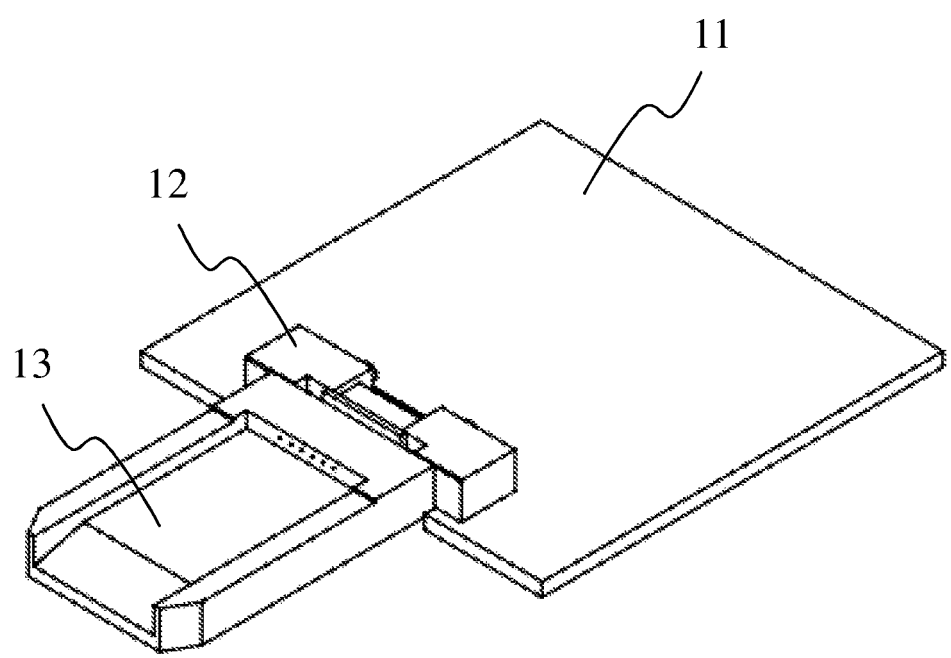
FIG. 4A is a perspective view of the first embodiment.
Figure 4B:
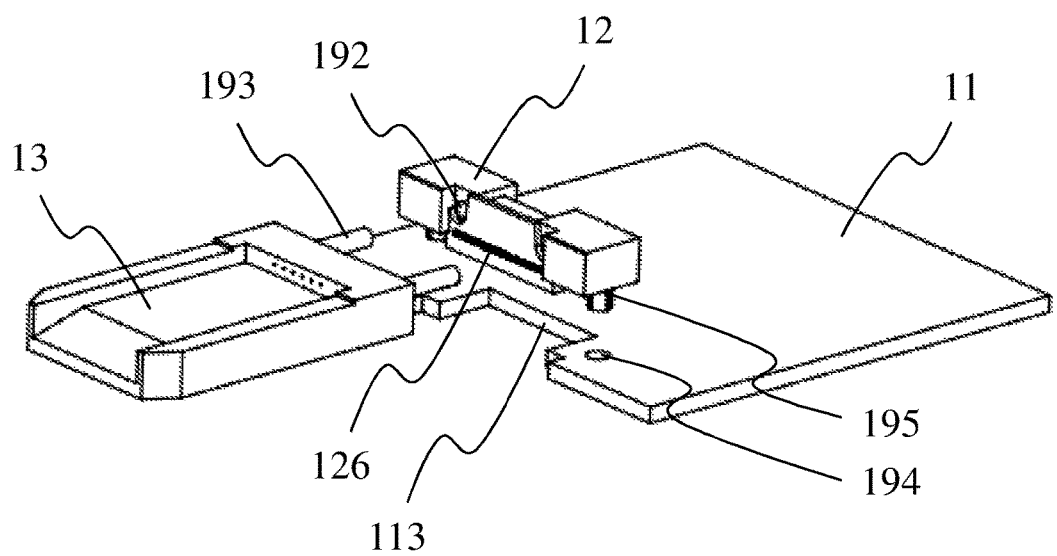
FIG. 4B is an exploded view of the first embodiment.
Figure 4C:
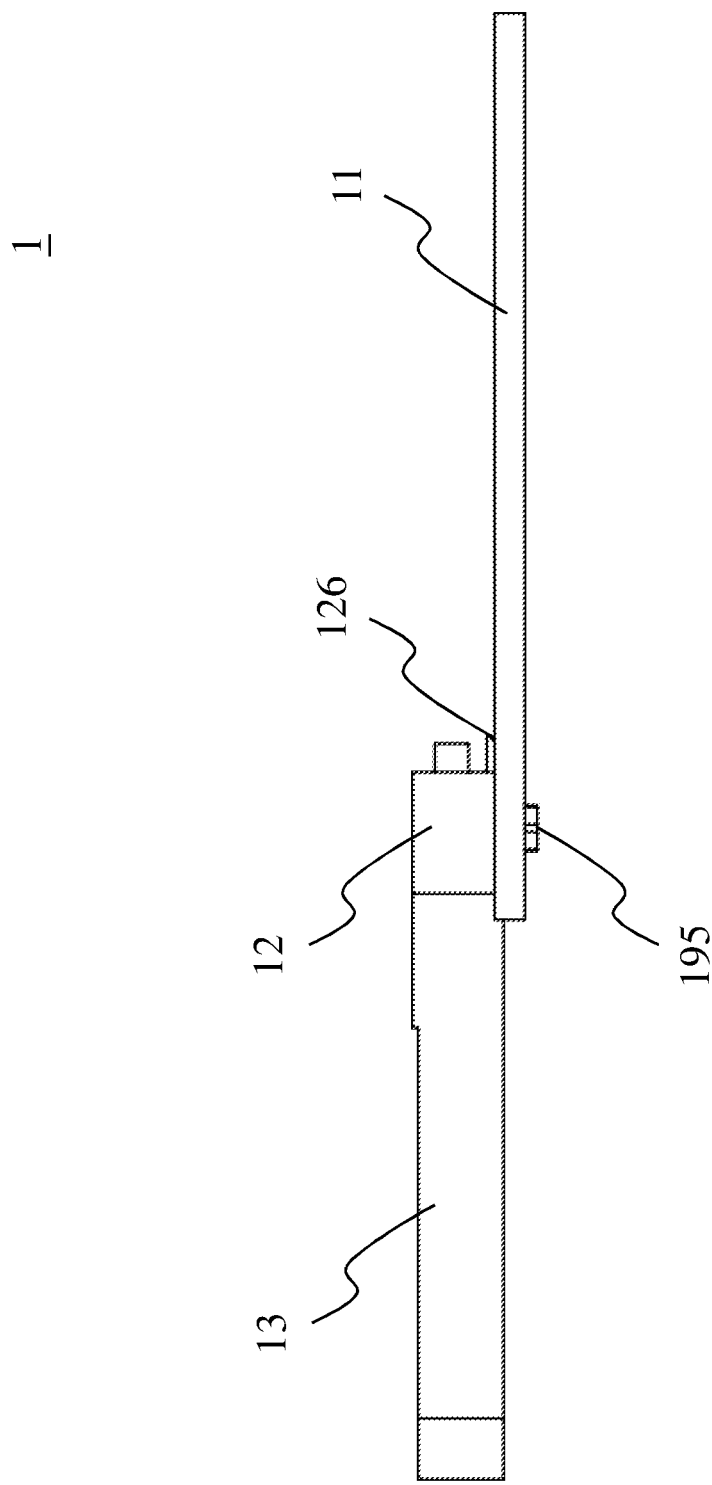
FIG. 4C is a right view of the first embodiment.

FIGS. 4A, 4B and 4C are a perspective view, an exploded view, and a right view of the first embodiment of the optical connector assembly 1. The optical connector assembly 1 includes a fixing portion 12, a fiber joint 13 and a PCB 11. The fiber joint 13 is, but is not limited to, a mechanically transferable fiber connector (MT fiber connector) or a multi-fiber push-on connector (MPO fiber connector).

Figure 4D:
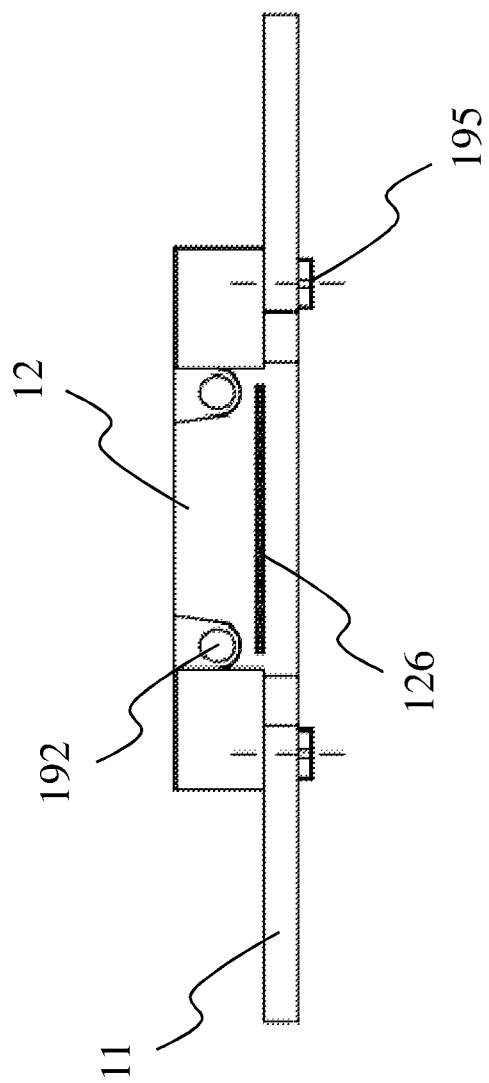
FIG. 4D is a front view of the first embodiment.

As shown in the FIG. 4A~4D, the PCB 11 includes fixing slots 194. The fixing portion 12 includes at least one optical device, the optical device is an optical transmitter or an optical receiver, and it not be shown in figure. More, the fixing portion 12 includes electrical pins 126, positioning slots 192 and fixing pins 195. The fiber joint 13 includes openings 133 and positioning pins 193. In particular, the electrical pins 126 are not necessary to be disposed at the front side of the fixing portion 12, which the structure of this embodiment is for description purpose, but not to limit the scope of this disclosure. Then, FIG. 4D is a front view of the optical connector assembly 1 with the separate fiber joint 13.

Obviously, it is seen that a notch 113 is formed at the edge of the PCB 11 in FIG. 4B. By plugging the fixing pin 195 into the fixing slot 194, the fixing portion 12 can fit into the notch 113 rendering the electrical pins 126 flush with the supporting surface 111 of the PCB 11 as shown in FIG. 4C. The notch 113 can also be provided by an opening structure in the PCB 11, that the fixing portion 12 is fit into the notch 113 and the electrical pins 126 are consequently flush with the surface of the PCB 11. Besides, the fixing portion 12 may be assembled with the PCB 11 by other methods like gluing, screwing or wedging. In these cases, the fixing pin 195 and the fixing slot 194 may not be necessary so as to be omitted in the optical connector assembly 1 of this disclosure.

More, the fiber joint 13 is assembled with the fixing portion 12 by plugging the positioning pins 193 into the positioning slots 192. After the fibers 15 are inserted into the openings 133, the optical connector assembly 1 is self-aligned to the optical device especially for the path of light transmission. By the way, the electrical pins 126 are flush with the surface of the PCB 11 as shown in FIG. 4C and FIG. 4D, which will offer a better signal quality and lower electronic-magnetic interference (EMI) in a comparison with those electrical pins away from the supporting surface 111 of the PCB 11 by a certain height.

Figure 5A:
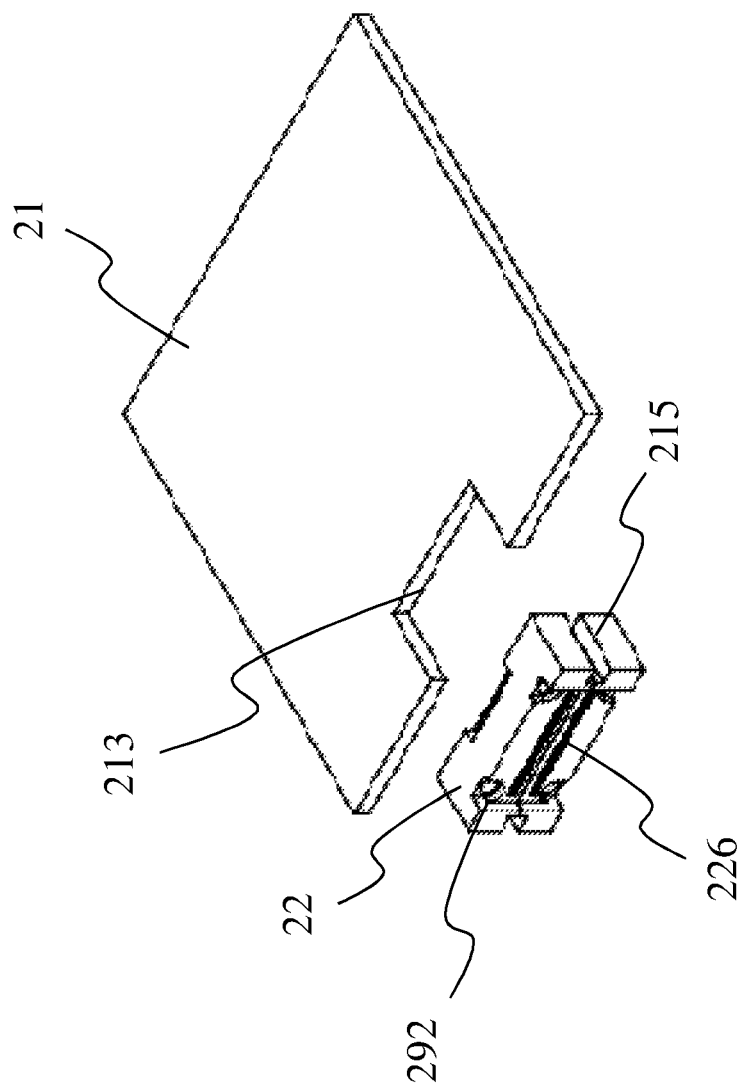
FIG. 5A is an exploded view of the first embodiment.
Figure 5B:
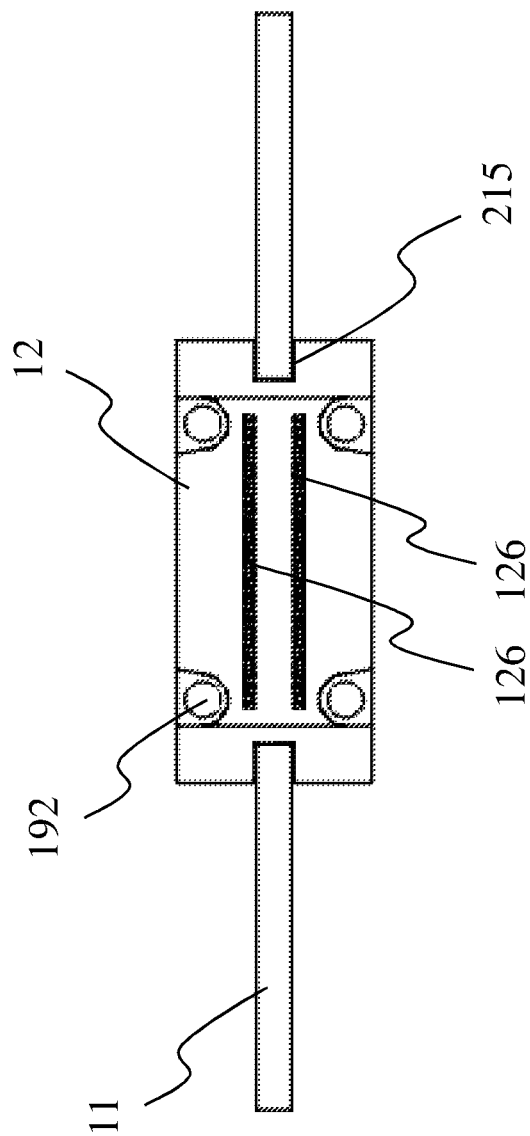
FIG. 5B is a front view of the first embodiment.
Figure 5C:
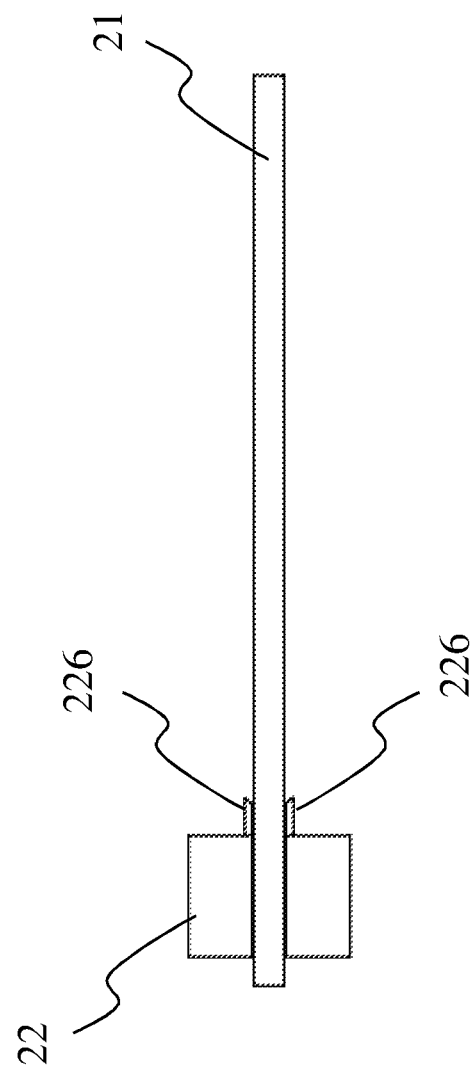
FIG. 5C is a right view of the first embodiment.

FIG. 5A~C are an exploded view, a front view, and a right view of a second embodiment of the optical connector assembly 2. The fiber joint is not shown in FIG. 5A~5C, and then a PCB 21 refers to corresponding parts in the optical connector assembly 1 in FIG. 4A~4D. A fixing portion 22 includes electrical pins 226 arranged in two arrays, positioning slots 292 and a guiding groove 215 to match a notch 213 formed at the edge of the PCB 21. Here, the positioning slots 292 refer to the positioning slots 192 in FIG. 4B and FIG. 4D.

The fixing portion 22 is assembled to the PCB 21 by wedging the notch 213 in the guiding groove 215 on the side walls of the fixing portion 22. Consequently, two arrays of electrical pins 226 are flush with both sides of the PCB 21 regard as two supporting surfaces 211 as shown in FIGS. 5B and 5C. The two arrays of electrical pins 226 are set to improve signal transport with an EMI protection. Therefore, the optical connector assembly 2 can achieve the same signal quality and lower electronic-magnetic interference (EMI), and the size of the optical connector assembly 2 is optimized when a number of electrical pins are required.

Also, the fixing portion 22 may be assembled with PCB 21 by other methods like gluing, screwing or wedging. In these cases, the guiding groove 215 of the fixing portion 22 may not be necessary so as to be omitted in the optical connector assembly 1 of this disclosure. Besides, it is noted that two fiber joints 13 with the structure shown in FIG. 4A~4C are adapted to the fixing portion 22, or one fiber joint 23 with two corresponding arrays of the openings 233 are further required for a better integration on structure assembling.

Figure 6A:
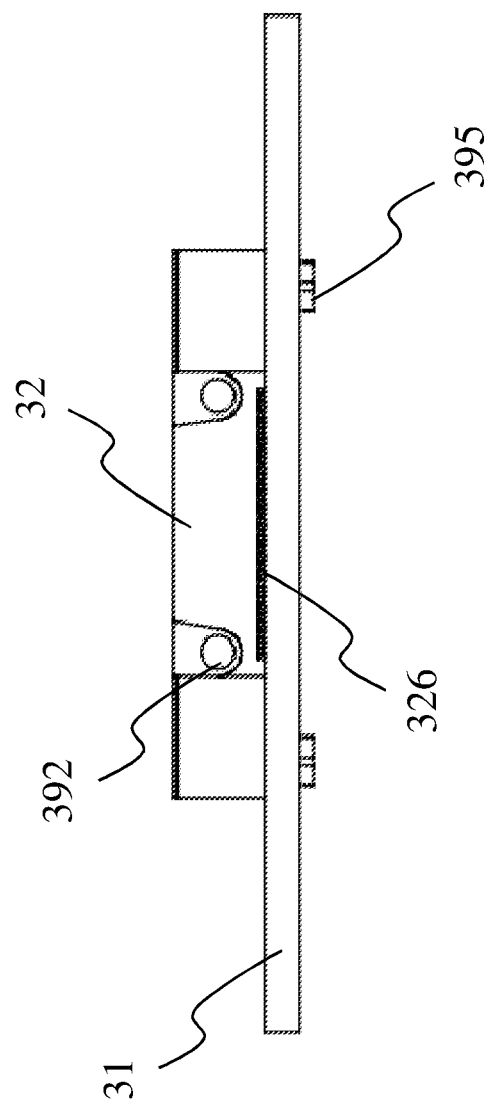
FIG. 6A is a front view of the third embodiment.
Figure 6B:
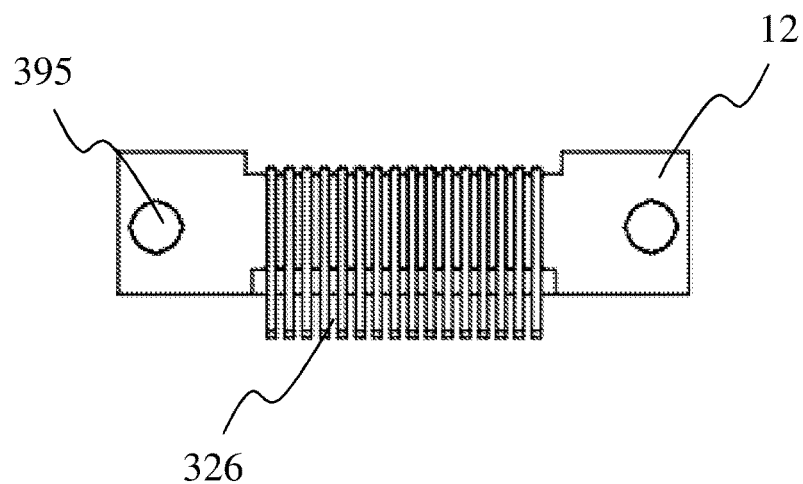
FIG. 6B is a right view of the third embodiment.
Figure 6C:
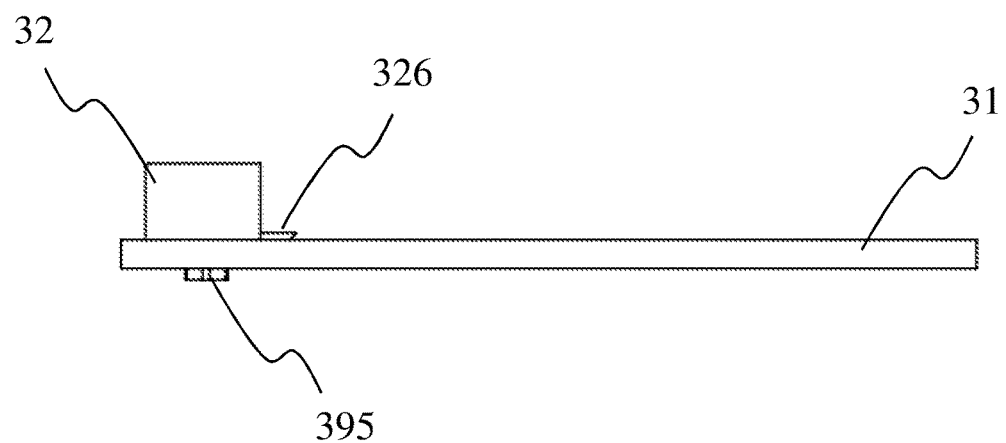
FIG. 6C is a right view of the third embodiment.

FIG. 6A and FIG. 6C are a front view and a right view of a third embodiment of the optical connector assembly of this disclosure without the fiber joint. FIG. 6B is a bottom view of the fixing portion 32 adapted in the third embodiment of the optical connector assembly 3. In this embodiment, the fiber joint which is not shown in FIG. 6A~6C and the PCB 31 refers to corresponding parts in the optical connector assembly 1 in FIG. 4A~4D. The fixing portion 32 includes positioning slots 392, fixing pins 395 and electrical pins 326. The positioning slots 392 refer to the positioning slots 192 in FIG. 4B and FIG. 4D.

Refer to FIG. 6B, the electrical pins 326 are wedged in and exposed on the bottom surface of the fixing portion 32 such that the bottom of the fixing portion 82 is flush with the surface of the PCB 31, and the electrical pins 326 are directly contacted the surface of the PCB 31 as shown in FIG. 6C. Besides, assembling the fixing portion 32 with the PCB 31 is carried out by the fixing pin 395 as well as other methods like gluing, screwing or wedging. In these cases, the fixing pin 395 may not be necessary so as to be omitted in the optical connector assembly 3 of this disclosure.

More importantly, all the non-contacting optical transmission interfaces and the optical connector assembly disclosed in this invention is applied for the interfaces of tablet PC's, docking stations of notebook computers, desktop computers and these interfaces of any other electronic devices required for data communication.

In a further embodiment of the first embodiment, the optical connector assembly 3 it can achieve the same signal quality and lower electronic-magnetic interference (EMI) with the design of structures on the fixing portion 32, and also the specific notch 113, 213 on the PCB do not be required anymore. Instead, the surface mount technology (SMT) is required for electrically connecting the fixing portion 32 and the PCB 31 without any special structures on the PCB 31. Thus, the fixing portion 32 is regarded as one of the surface mount device (SMD) like other devices mounted on the PCB 31. As a result, it will save time and cost for assembling above structures.

Next, the chip configuration will be described more detail in the following embodiments. FIG. 7A is a first type of chip configuration in the optical connector assembly as a fourth embodiment. The part of optical connector assembly for converting signals to transmitting light includes a first chip 741 and a second chip 782 on a fixing portion 72.

The fixing portion 72 includes two sides with an cross angle to define a first surface 721 and a second surface 722, where the angle between the first surface 721 and the second surface 722 is from 0 degrees to 180 degrees. Referring to FIG. 7A, the cross angle is 90 degrees for the first chip 741 parallel to the second surface 722 to define an optical path of the light transmission. The first chip 741 and the second chip 742 are disposed on the first surface 721, and then the first chip 741 is an optical transmitter such as a laser diode and the second chip 742 is a driver such as a laser driver to drive the first chip 741 for emitting light.

The first chip 741 and the second chip 742 are electrically connected by wire bonding 7401, and the second chip 742 is also electrically connected to electrical pins for other application circuits on such as PCB by wire bonding 7402. Additionally, the first chip 741 and the second chip 742 are electrically connected through a conducting line or bonding pads disposed on the first surface 721 or the second surface 722 of the fixing portion 72. Thus, the pins are adapted for wire bonding 7402 to build up the electrical connection between the second chip 742 and the second surface 722. Nonetheless, the wire bonding 7402 can also be bonded to the first surface 721 as long as it is establish the electrical connection between the second chip 742 and the pins on the first surface 721.

FIG. 7B is a counterpart of the first type, where the chip configuration disclosed in FIG. 7A and in FIG. 7B are respectively for transmitting and receiving light in the optical connector assemblies. In other words, they are a pair of the first type chip configuration which can perform the function of converting signals for transmitting and receiving light. The structure of chip configuration is symmetrical, such that this part still includes a first chip 781 and a second chip 782 on a fixing portion 76.

Referring to FIG. 7B, the first chip 781 is replaced by an optical receiver such as a photo detector, which detects the light and transforms it into an electrical signal. The second chip 782 is a signal processing circuit like an amplifier to deal with the electrical signal for communication. The first chip 781 is bonded on the first surface 761 and connected to the second chip 782 by the wire bonding 7801. And, the second chip 782 is bonded to the first surface 761 or the second surface 762 by the wire bonding 7802.

Figure 8B:
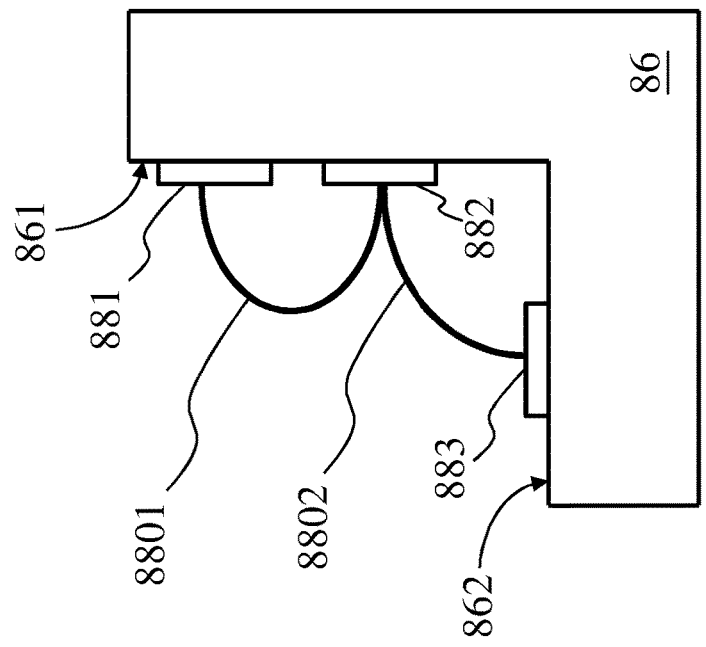
FIG. 8B is a second type of the chip configuration for receiving light.
Figure 8A:
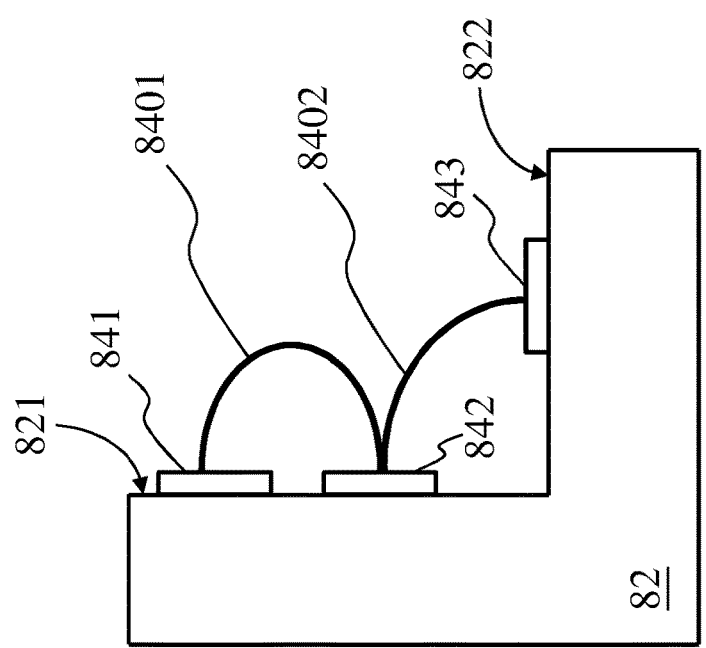
FIG. 8A is a second type of the chip configuration for transmitting light.

FIG. 8A is a second type of chip configuration in the optical connector assembly as a fifth embodiment. The optical connector assembly includes a fixing portion 82, a first chip 841, a second chip 842 and a third chip 843 on the fixing portion 82, which the first chip 841 and the second chip 842 refers to the first chip 741 and the second chip 742 on the fixing portion 72 disclosed in FIG. 7A.

In this embodiment, the third chip 843 on the second surface 822 is additionally provided with a signal pre-processing circuit, such as a memory control circuit, a memory circuit, a graphic processing unit (GPU), a display port, or a microprocessor unit (MPU). The first chip 841 is electrically connected to the second chip 882 by wire bonding 4401. Similarly, the second chip 882 is electrically connected to the third chip 843 by wire bonding 4402.

FIG. 8B is a counterpart of the second type chip configuration, where this chip configuration disclosed in FIG. 8A and FIG. 8B are respectively for transmitting and receiving light by converting signals in the optical connector assemblies. The symmetrical structure of chip configuration includes a first chip 881, a second chip 882 on the first surface 861 and a third chip 883 on the second surface 862 of a fixing portion 86.

In this embodiment, the first chip 881 and the second chip 882 refers to the first chip 781 and the second chip 782 respectively disclosed in FIG. 7B. And, the third chip 883 is additionally provided with a signal post-processing circuit such as a memory control circuit, a memory circuit, a graphic processing unit (GPU), a display port or a microprocessor unit (MPU).

FIG. 9A is a third type of chip configuration in the optical connector assembly as a sixth embodiment. The optical connector assembly includes a fixing portion 92, a first chip 941 and a third chip 943 on the fixing portion 92, which the first chip 941 refers to the first chip 741 on the fixing portion 72 disclosed in FIG. 7A.

In this embodiment, the third chip 943 on the second surface 922 is additionally provided with a signal pre-processing circuit, such as a memory control circuit, a memory circuit, a graphic processing unit (GPU), a display port, or a microprocessor unit (MPU) like in a fourth embodiment. More importantly, the first chip 941 is provided for integrating the functions of the first chip 841 and the second chip 842 shown in FIG. 8A, and the first chip 941 on the first surface 921 is electrically connected to the third chip 943 on the second surface 922 by wire bonding 9401.

FIG. 9B is a counterpart of the third type chip configuration, where the chip configuration disclosed in FIG. 9A and in FIG. 9B are respectively for transmitting and receiving light by converting signals in the optical connector assemblies. The structure of chip configuration is symmetrical to have a first chip 981 on the first surface 961 and a third chip 983 on the second surface 962 of a fixing portion 96. The first chip 981 is provided for integrating the functions of the first chip 881 and the second chip 882 shown in FIG. 8B.

In above embodiments, it is known that the chips are electrically connected to one another by wire bonding. According to transmitting light in the optical connector, first, the chip is provided with two chips for a laser diode and a laser driver disposed on the first surface of the fixing portion. Second, the chip is provided with three chips for a laser diode and a laser driver disposed on the first surface of the fixing portion and for a signal pre-processing circuit disposed on the second surface of the fixing portion. Third, the chip is provided with two chips for a laser diode disposed on the first surface of the fixing portion and a signal pre-processing circuit disposed on the second surface of the fixing portion.

According to receiving light in the optical connector, first, the chip is provided with two chips for a photodetector and an amplifier disposed on the first surface of the fixing portion. Second, the chip is provided with three chips for a photodetector and an amplifier disposed on the first surface of the fixing portion and for a signal post-processing circuit disposed on the second surface of the fixing portion. Third, the chip is provided with two chips for a photodetector disposed on the first surface of the fixing portion and a signal post-processing circuit disposed on the second surface of the fixing portion.

It is believed that the present embodiments will be understood by the foregoing description and illustration. The principles and the features of the present disclosure is employed in various embodiments thereof without departing from the scope of the disclosure as claimed. But, the above embodiments are merely to illustrate the possible scope of the disclosure, rather than to restrict the scope of the invention.

What is claimed is:

1. An optical connector assembly, comprising:
    a printed circuit board, including at least one supporting surface and a notch formed on an edge of the printed circuit board;
    a fixing portion, located above the supporting surface, including:
        a first surface perpendicular to the supporting surface;
        at least one second surface perpendicular to the first surface and parallel to the supporting surface;
        a plurality of lead frames and a plurality of electrical pins, wherein the lead frames are disposed on the fixing portion, and the electrical pins are parallel to the supporting surface for electrically connecting with the lead frames; and
        at least one positioning slot, disposed on the first surface of the fixing portion;
    wherein portion of the fixing portion under the electrical pins is embedded in to the notch of the printed circuit board, so that the electrical pins touch and are parallel the supporting surface for electrically connecting with printed circuit board;

a joint portion, located above the supporting surface, including:
- a first portion, including a first side parallel to the first surface;
- a second portion, perpendicular to the first portion of the joint portion and extending from the first portion to cover the top of the fixing portion;
- a plurality of openings penetrating the first portion of the joint portion; and
- at least one positioning pin disposed on the first side of the joint portion;

a containing space, located above the printed circuit board and formed between the fixing portion and the joint portion, wherein the opening of the joint portion connect with the containing space;

a plurality of chips, disposed on the fixing portion within the containing space for electrically connecting the lead frame and performing a light transmission of transmitting and receiving optical signals;

a plurality of fibers, inserted through the openings of the joint portion; in a direction parallel to the supporting surface; and wherein the positioning pin passes through the containing space from the first side of the joint portion to the fixing portion and is engaged into the positioning slot, such that the fibers are coaxially aligned with the chips for light straight pass through the containing space.

2. The optical connector assembly of claim 1, wherein the fixing portion including a plurality of fixing pins are mounted on the printed circuit board including a plurality of fixing slots for the engagement of the fixing pins and the fixing slots.

3. The optical connector assembly of claim 1, wherein at least a part of the bottom of the fixing portion is embedded into the notch of the printed circuit board along a direction perpendicular to the supporting surface of the printed circuit board.

4. The optical connector assembly of claim 1, wherein the fixing portion is embedded into the notch of the printed circuit board for at least one guiding groove on the fixing portion to clamp the notch of the printed circuit board.

5. The optical connector assembly of claim 1, wherein the chip is provided with two chips for a laser diode and a laser driver disposed on the first surface of the fixing portion as transmitting light in the optical connector assembly.

6. The optical connector assembly of claim 1, wherein the chip is provided with two chips for a photodetector and an amplifier disposed on the first surface of the fixing portion as receiving light in the optical connector assembly.

7. The optical connector assembly of claim 1, wherein the chip is electrically connected to one another by wire bonding.

8. The optical connector assembly of claim 1, wherein the chip disposed on the fixing portion is electrically connected to the lead frame by wire bonding.

9. The optical connector assembly of claim 1, wherein the lead frame is electrically connected to the supporting surface of printed circuit board by soldering on the side wall of the fixing portion.

* * * * *